(12) United States Patent
Badapanda

(10) Patent No.: US 10,027,122 B2
(45) Date of Patent: Jul. 17, 2018

(54) HIGH VOLTAGE DC POWER SUPPLY FOR HIGH POWER RADIO FREQUENCY AMPLIFIERS

(71) Applicant: THE SECRETARY, DEPARTMENT OF ATOMIC ENERGY, Mumbai, Maharashtra (IN)

(72) Inventor: Manmath Kumar Badapanda, Madhya Pradesh (IN)

(73) Assignee: THE SECRETARY, DEPARTMENT OF ATOMIC ENERGY, Mumbai, Maharashtra (IN)

( * ) Notice: Subject to any disclaimer, the term of this patent is extended or adjusted under 35 U.S.C. 154(b) by 212 days.

(21) Appl. No.: 15/226,620

(22) Filed: Aug. 2, 2016

(65) Prior Publication Data

US 2017/0310111 A1   Oct. 26, 2017

(30) Foreign Application Priority Data

Apr. 22, 2016   (IN) .............................. 201621014164

(51) Int. Cl.
   *H02J 1/00*   (2006.01)
   *H02J 3/00*   (2006.01)
   (Continued)

(52) U.S. Cl.
   CPC ................. *H02J 3/36* (2013.01); *H02M 1/12* (2013.01); *H02M 1/4216* (2013.01);
   (Continued)

(58) Field of Classification Search
   CPC .... H02M 2001/007; G06F 1/182; G06F 1/20; H02J 1/102; H02J 3/382
   (Continued)

(56) References Cited

U.S. PATENT DOCUMENTS

| 2014/0097747 A1* | 4/2014 | Bader | ..................... H01J 23/34 |
| | | | 315/3 |
| 2016/0380429 A1* | 12/2016 | Krstic | ....................... H02J 1/00 |
| | | | 307/77 |
| 2017/0250610 A1* | 8/2017 | Alecsandrin | ............ H02M 3/24 |

FOREIGN PATENT DOCUMENTS

WO   WO 2010074434 A2 *   7/2010   .......... H02M 3/3378

OTHER PUBLICATIONS

M. K. Badapanda et al., "Klystron Bias Power Supplies for Indus-2 Synchrotron Radiation Source", IETE Journal of Research, vol. 54, Issue 6, Nov.-Dec. 2008, pp. 403-413.
(Continued)

*Primary Examiner* — Quan Tra
(74) *Attorney, Agent, or Firm* — Merchant & Gould P.C.

(57) ABSTRACT

The present invention provides a high voltage regulated DC power supply with full range 24 pulse input for ripple free output for high power RF amplifier, comprising: full range 24 pulse 3 phase 11 kV input system configured to provide uncontrolled low voltage DC bus, low input harmonics and high input power factor; a plurality of DC-DC power modules having their output connected in a series and coupled to the said DC bus voltage; each power module comprising a DC source, an inverter bridge IGBTs operating at predefined duty cycle and staggered to reduce the output ripple and output stored energy; and a combination of feed forward and feedback control circuit adapted to regulate the variations in the input line voltage and the variation in output at various load current to finally obtain ripple free high voltage output.

20 Claims, 15 Drawing Sheets

(51) Int. Cl.
*H02J 3/36* (2006.01)
*H02M 3/335* (2006.01)
*H02M 7/5387* (2007.01)
*H03F 1/02* (2006.01)
*H03F 3/19* (2006.01)
*H02M 1/12* (2006.01)
*H02M 1/42* (2007.01)
*H02M 3/337* (2006.01)
*H02M 7/08* (2006.01)
*H02M 1/00* (2006.01)

(52) U.S. Cl.
CPC ....... *H02M 3/337* (2013.01); *H02M 3/33507* (2013.01); *H02M 7/08* (2013.01); *H02M 7/53871* (2013.01); *H03F 1/0238* (2013.01); *H03F 3/19* (2013.01); *H02J 2003/365* (2013.01); *H02M 2001/007* (2013.01); *H02M 2001/0016* (2013.01); *H02M 2001/0077* (2013.01); *H03F 2200/451* (2013.01)

(58) Field of Classification Search
USPC .......................................... 307/77; 323/282
See application file for complete search history.

(56) References Cited

OTHER PUBLICATIONS

J. Bradley III et al., "Operational Experience With Two Types of 2 MW HVDC Power Supplies on LEDA", Proceedings of the 1999 Particle Accelerator Conference, New York, 1999, pp. 1010-1012.
W. Forster et al., "High-Voltage, High-Power, Pulse-Step Modulators for the Accurate Supply of Gyrotron and Other Heating Devices", Conference Record of the Twenty-Fifth International Power Modulator Symposium, 2002 and 2002 High-Voltage Workshop, Jun. 30-Jul. 3, 2002, pp. 126-129.
A. J. Moss et al., "Upgrade of the SRS Klystron Power Supply", Proceedings of the 2001 Particle Accelerator Conference, Chicago, Jun. 18-22, 2001, pp. 3675-3677.
I. S. Roth et al., "A Solid State Opening Switch and MOD Anode Supply for the Advanced Light Source Klystrons", Proceedings of EPAC 2002, Paris, France, Jun. 30-Jul. 3, 2002, pp. 2484-2486.

* cited by examiner

HIGH VOLTAGE DC POWER SUPPLY FOR HIGH POWER RADIO FREQUENCY AMPLIFIERS

TECHNICAL FIELD OF THE INVENTION

The present invention relates to high voltage DC power supply system for RF amplifiers and more particularly to a high voltage DC power supply with full range 24 pulsed input and ripple free output for RF amplifiers comprising a plurality of DC power modules connected in series to provide −36 kV regulated DC output.

BACKGROUND OF THE INVENTION

High power radio frequency (RF) amplifiers demand stringent performances from their bias power supplies. Tighter output voltage regulations with better stability, lower output ripples, lower stored energies etc., are some of the output performance requirements and lower input harmonics, better Input Power Factors (IPF) etc., are crucial input performance requirements of these power supplies. Most of these requirements are contradictory in nature. For example, in high power regulated DC power supplies, the output ripple increases with the increase in control range of output voltages requiring bigger ripple filters, which in turn stores substantial energy. But RF amplifiers are sensitive to stored energies during internal flashover, arcing, etc., and can handle maximum up to 20 Joules of stored energy, the realization of which is a major challenge to the designer. Traditionally, crowbars are placed across filter capacitors of these DC power supplies to bypass stored energies under any unfavorable conditions. Bigger ripple filters also reduces control bandwidth deteriorating output voltage stability. Another challenge encountered with high power regulated DC power supplies is the generation of substantial line harmonics as well as significant deterioration of the input power factor. These aspects are being given increasing attention as the use of solid state semiconductor devices have increased significantly in recent past and will continue to increase further due to its ability for the better control of processes and its miniaturization. But they are inherently non-linear, generating harmonics current in the line as well as deteriorating the input power factor significantly. Several topologies have been adopted worldwide for high voltage DC bias power supplies of high power RF amplifiers.

Reference is made to M. K. Badapanda and P. R. Hannurkar, "Klystron bias power supplies for Indus-2 Synchrotron Radiation Source", IETE Journal of Research, Vol. 54, no. 6, pp. 403-412, November, 2008. In the prior art, topology 10 as shown in FIG. 1 uses SCRs in AC regulator configuration 11 for regulating output voltage of an high voltage DC (HVDC) power supply at the desired level under possible input and output variations. The secondaries of the main transformer are splitted into two parts, one connected in STAR 12, while the other in DELTA 13 and each is feeding to its corresponding 3-phase diode bridge 14 and 15. Suitable output ripple filter is employed in L-C configuration 16 to minimize the output ripple. In addition, crowbar protections 17 are employed to bypass output filter stored energies under any unfavorable conditions. A 3-phase series limiting inductor 18 is also employed in the primary side to limit the short circuit current. This series limiting inductor in conjunction with suitable detuned line filter 19 minimizes the input harmonics current going back into the input supply system as well as improves the input power factor. However, the scheme stores substantial energy in their output ripple filter 16 even after cutting off the input supply, requiring suitable crowbar 17 to bypass these stored energies for protecting the sensitive RF amplifier, under any unfavorable conditions. Further, although the input system is 12 pulsed at very low firing angle, it becomes 6 pulsed at higher firing angles. As the firing angle of SCRs in the AC regulator increases, the ripple at the output increases needing more filtering. This output filter in conjunction with 6 pulsed AC regulator control reduces the control bandwidth significantly. Furthermore, AC regulator control also increases the line harmonics and deteriorates the input power factor significantly discouraging its use for high power applications Reference is made to J. Bradley III, D. Rees, R. Przeklasa, R. Jaitly, G. Schofield, M. Scott, "Operational experience with two types of 2 MW HVDC power supplies on LEDA", Proceedings of the Particle Accelerator Conference, pp. 1010-1012, New York, 1999 and A. J. Moss, R. J. Smith, S. A. Griffiths, "Upgrade of the SRS klystron power supply", Proceedings of the 2001 Particle accelerator conference, Chicago, 2001. FIG. 2 shows the schematic of an exemplary prior art, topology 20, where 3-phase, medium voltage input 21 is first step down to a controllable voltage of 1.5 kV by a transformer 22 having two secondary windings, one in star and other in delta, resulting 30° shifted input line voltages. These voltages are controlled by 3-phase SCR bridges 23 and 24 and fed to two numbers of step up transformers having open primary windings 25 and 26. The secondary output of these transformers are rectified and connected in series as shown in FIG. 2. The input system becomes 12 pulsed generating lesser input harmonics and better input power factor in comparison to that of FIG. 1. The filter inductors 27 and 28 in input 3-phase SCR bridges help in reducing output filter capacitance 29 requirement appreciably to meet the output ripple criteria. However, this scheme stores substantial energy in the primary bridge inductors 27 and 28, which needs to be dissipated under unfavorable conditions. Further, although the input system is 12 pulsed, but the scheme still requires crowbar for protecting RF amplifiers as well as input line filters to limit line harmonics.

Reference is further made to I. S. Roth, J. A. Casey, M. P. J. Gaudreau, M. A. Kempkes, T. J. Hawkey, J. M. Mulvaney, "A solid state opening switch and mod anode supply for the advanced light source klystrons", IEEE Twenty Fifth International Conference on Power Modulator Symposium, pp. 453-456, California, June 2002 and A. J. Moss, R. J. Smith, S. A. Griffiths, "Upgrade of the SRS klystron power supply", Proceedings of the 2001 Particle accelerator conference, Chicago, 2001. FIG. 3 shows the schematic of another exemplary prior art, topology 30, where the high voltage DC 31 is first regulated by a solid state IGBT series switch 32 in bulk regulator configuration and suitably filtered 33 and 34. The second switch 35 is used as fast acting series opening switch operated in ON/OFF mode as a replacement of crowbar, which will isolate the load from stored energies in the filter under any unfavorable conditions. However, the said scheme is dependent on the availability and reliability of high voltage series connected solid state switches 32 and 35 and their associated driver circuits. Moreover, the high voltage series switch 32 can be operated only in few kHz range needing appreciable output filtering 33 and 34, restricting the control bandwidth of the power supply. Since significant energies are stored in this filter, they require another high voltage series opening switch 35 to isolate the load from these stored energies under its unfavorable arcing conditions.

Reference is further made to J. Bradley III, D. Rees, R. Przeklasa, R. Jaitly, G. Schofield, M. Scott, "Operational experience with two types of 2 MW HVDC power supplies on LEDA", Proceedings of the Particle Accelerator Conference, PP. 1010-1012, New York, 1999; W. Forster, J. Alex, "High-voltage, high-power, pulse-step modulators for the accurate supply of gyrotron and other heating devices", IEEE Twenty Fifth International Conference on Power Modulator Symposium, pp. 126-129, California, June, 2002 and A. J. Moss, R. J. Smith, S. A. Griffiths, "Upgrade of the SRS klystron power supply", Proceedings of the 2001 Particle accelerator conference, Chicago, 2001. FIG. 4 shows the schematic of a prior art, solid state topology 40, where two numbers of multi secondary transformers 41 and 42, primary winding of one is connected in Star 43 and the other in Delta 44. All the secondary windings are connected in Star 45 and 46, suitably rectified 47, filtered 48 with an IGBT 49 in each operated in chopper mode and are connected in series. The input system is 12 pulsed, generating lesser input harmonics and better input power factor in comparison to 6 pulsed system requiring only lower rated input line filter. In this scheme, the series connection of module outputs minimizes the output filter capacitances significantly requiring only a lower rated crowbar for the protection of sensitive high power RF amplifiers under any unfavorable conditions. However, the said scheme employs multi secondary transformers 41 and 42, which are difficult to fabricate. Further, the mutual coupling among the various windings 43 to 45 and 46 alters the voltage ratios different from their actual turns ratio, resulting in different DC voltages from different power modules, which comes on the way of achieving 12 pulse input system. The control of this power supply is on high voltage side, which demands complex sensing as well as costly fibre optics based communication system. In addition, parasitic capacitances in the secondary windings of multi secondary transformers 45 and 46 are charged up to the highest voltage in the system, which hardly find any paths for their discharges in spite of tripping module switchgears and IGBTs 49 under any unfavorable situations leaving high voltage safety related issues. Furthermore, if one of the power module fails, the input system corresponding to its associated module becomes 6 pulsed requiring input line filter to limit line harmonics.

Thus, the drawback of conventional topologies of the controlled DC power supplies is that the control of output voltage affects both input performance parameters like input line harmonics, input power factors as well as output performance parameters like output ripple, output stored energy. Also, most of the schemes adopted for similar applications are either 6 pulsed or 12 pulsed and the line harmonics generated by them increases with increase in the control range deteriorating the input power factor significantly.

It is further noted that a p-pulse converter (p>1) under balanced and matched conditions of operations generates characteristics harmonics on the AC side of the order h given by $$h = pn \pm 1 \quad (1)$$

Where, n is any positive integer.

The magnitude of different harmonics current ($I_h$) is inversely proportional to their corresponding harmonics order (h) and is given by $$I_h = I_f / h \quad (2)$$

Where, $I_f$ is the magnitude of fundamental rms current.

It has been extensively realized that even a 12 pulsed input system, under classical infinite DC link inductances, generates almost 9% of $11^{th}$ harmonics, 8% of $13^{th}$ harmonics and so on. These values also increase further under practical conditions, along with the generation of some amount of 5th and 7th harmonics causing problem in limiting the line harmonics below that specified in the IEEE Std 519-1992. Again, input power factor (IPF), which is the product of displacement power factor and distortion power factor also reduces. The maximum total IPF, obtainable from a p-pulsed converter, assuming no phase retard, no commutation overlap and neglecting the transformer magnetizing current is given by Maximum total $$IPF = \frac{p}{\Pi} \sin\left(\frac{\Pi}{p}\right), \text{ for } p > 1 \quad (3)$$

Thus, the maximum IPF obtainable from a 6 pulsed, 12 pulsed and 24 pulsed uncontrolled rectifiers is 0.955, 0.988 and 0.997 respectively 51 and 52. Neglecting commutation overlap(μ) for uncontrolled rectifier, IPF reduces with transformer magnetizing current. The input power factor versus percentage reactance for 6 pulsed 53 and 12 pulsed 56 uncontrolled rectifiers with different magnetizing currents are presented in FIG. 5 for reference. It is noted that the input power factor versus percentage reactance curve for a 24 pulsed converter will lie above that of 12 pulsed converter. The current trend is to go behind higher pulsed converters for reduction of line harmonics as the harmonics generated by one of its converter are cancelled by those produced by the other converter inside it, thus help realizing the so called clean power conversion, which is of prime concern for the high power system.

It is thus required to develop a system with a crowbar less topology that provides a high voltage DC power supply with full range 24 pulsed input and ripple free output for RF amplifiers, where the control of its output voltage neither affects input line harmonics and input power factor nor affects the output ripple. Also, the input system has inherently low input harmonics and high input power factor making it suitable for high power applications.

SUMMARY OF THE INVENTION

The following presents a simplified summary of the invention in order to provide a basic understanding of some aspects of the invention. This summary is not an extensive overview of the present invention. It is not intended to identify the key/critical elements of the invention or to delineate the scope of the invention. Its sole purpose is to present some concept of the invention in a simplified form as a prelude to a more detailed description of the invention presented later.

Accordingly, it is an object of the present invention to overcome the drawbacks of the prior art and provide a high voltage regulated DC power supply for biasing high power RF amplifier.

It is another object of the present invention is to provide a high voltage DC power supply system with full range 24 pulsed input and ripple free output for RF amplifiers.

It is another object of the present invention is to provide a high voltage DC power supply system where the control of its output voltage neither affects input line harmonics and input power factor nor affects the output ripple.

It is another object of the present invention to provide a high voltage DC power supply system where faulty switch power modules are isolated online and the number of faulty (or healthy) switch power modules in this power supply neither affects input line harmonics and input power factor nor affects the output ripple.

It is another object of the present invention is to provide a topology of crowbar less high voltage DC power supply with full range 24 pulsed input and ripple free output for RF amplifiers where the input section is completely independent of the output control section.

It is another object of the present invention is to provide an input section that has lower input harmonics enabling the utility supply to cater to the requirement of other nonlinear loads without exceeding specified standard harmonics limit.

It is another object of the present invention is to provide a topology of high voltage DC power supply that has flexibility for increasing the output voltage to higher value by adding number of switch power modules in series.

It is another object of the present invention is to provide a high voltage DC power supply system where eight out of seventy two numbers of switch power modules are kept as active redundant to improve the system reliability.

It is yet another object of the present invention is to provide a high-voltage power supply that has a full range 24 pulsed input systems with inherently low input harmonics and high input power factor making it suitable for high power applications.

It is still another object of the present invention is to provide a high voltage regulated DC power supply that is either ripple free or have low output ripple, low output stored energy, crowbar less, high output stability, high overall efficiency, high system reliability and availability.

Accordingly, in one implementation, a high voltage regulated DC power supply system with full range 24 pulse input for ripple free output for high power RF amplifier, comprising:
an input system coupled to at least four 3-phase uncontrolled rectifiers and adapted to provide uncontrolled low voltage DC bus having low input harmonics and high input power factor;
a plurality of DC-DC power modules having their output connected in a series configuration and coupled to the said DC bus voltage of said input system;
each power module comprising
a DC source,
an inverter bridge IGBTs operating at predefined duty cycle and staggered to provide ripple free output and low output stored energy, receiving an input voltage from said DC source and providing an output DC voltage and
an output switch in series for selectively connecting said DC voltage to the output of said power module;
for each DC power module, a combination of feed forward and feedback control circuit is adapted to regulate the variations in the said input line voltage by presetting the phase shift of DC-DC modules near the desired level and to regulate output at various load current, and configured to provide signals to power module to obtain ripple free high voltage output.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE ACCOMPANYING DRAWINGS

The above and other aspects, features, and advantages of certain exemplary embodiments of the present invention will be more apparent from the following description taken in conjunction with the accompanying drawings in which.

Figure 1:
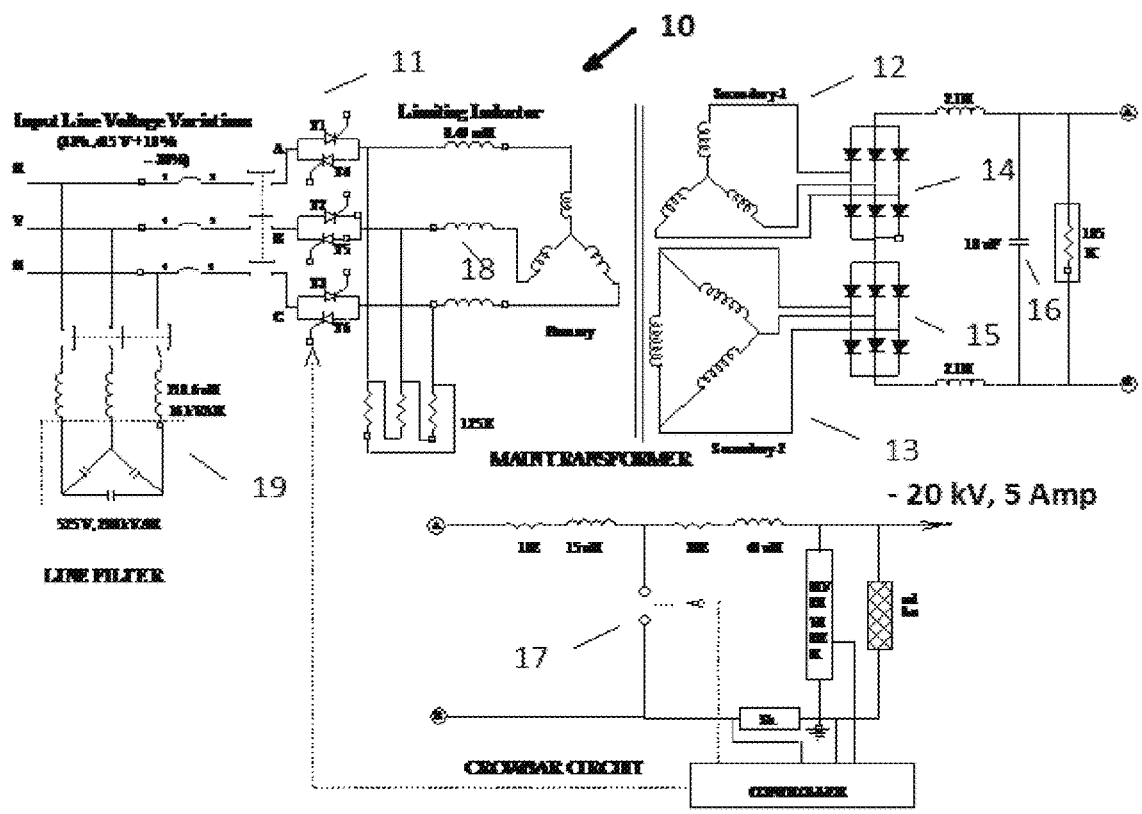
FIG. 1 illustrates schematic of a prior art topology of AC regulated based primary control of HVDC power supply.
Figure 2:
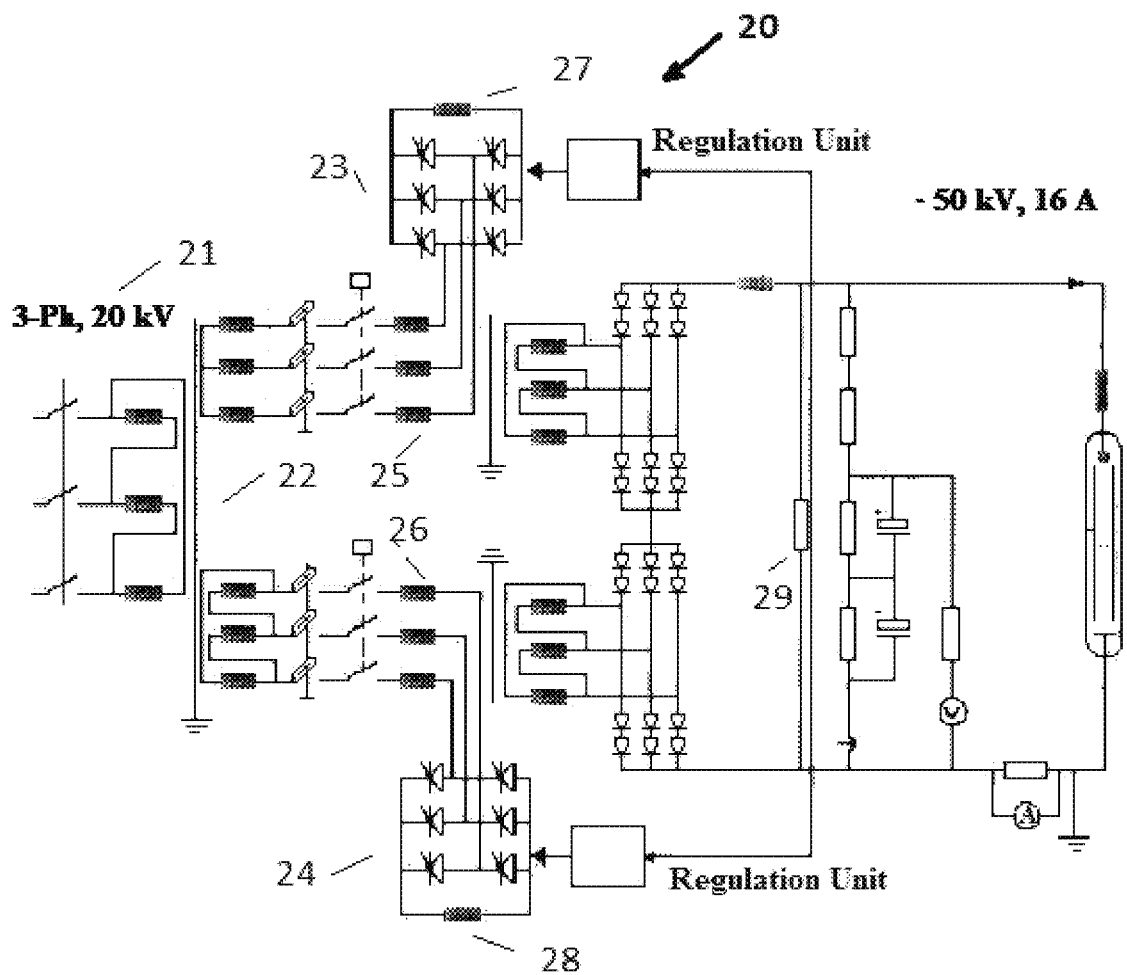
FIG. 2 illustrates schematic of a prior art topology of SCR bridge based primary controlled DC power supply demanding transformer primary windings open at both the end.
Figure 3:
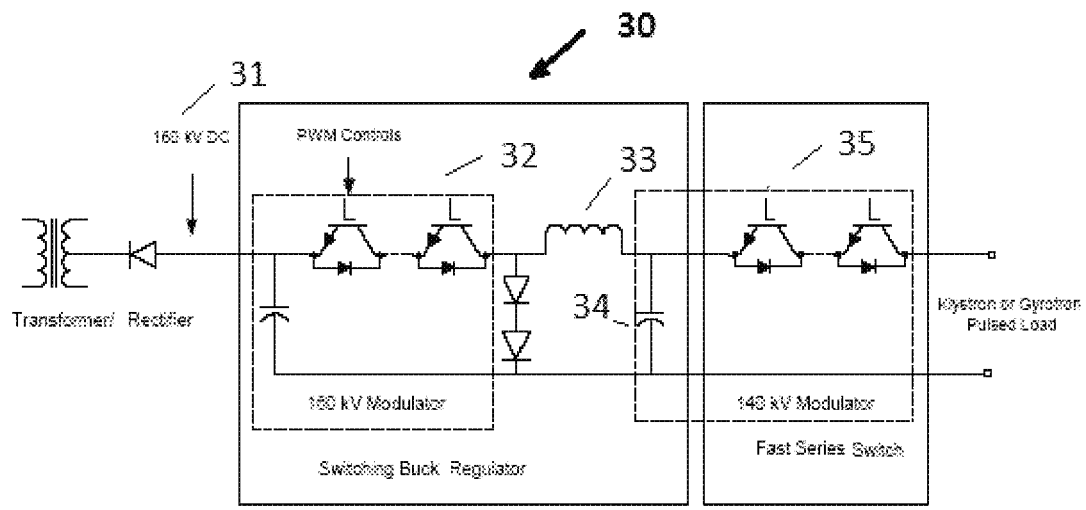
FIG. 3 illustrates schematic of a prior art topology of Solid state high voltage series switch based DC power supply.
Figure 4:
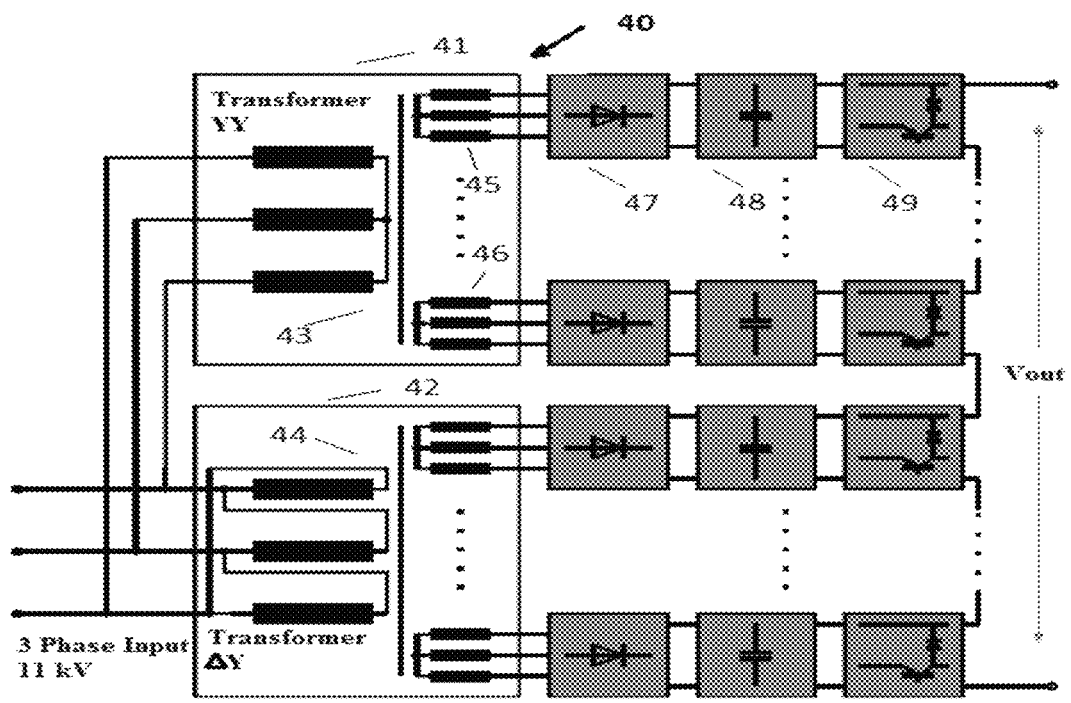
FIG. 4 illustrates schematic of a prior art topology of Multi secondary transformer based solid state modular power supply.
Figure 5:
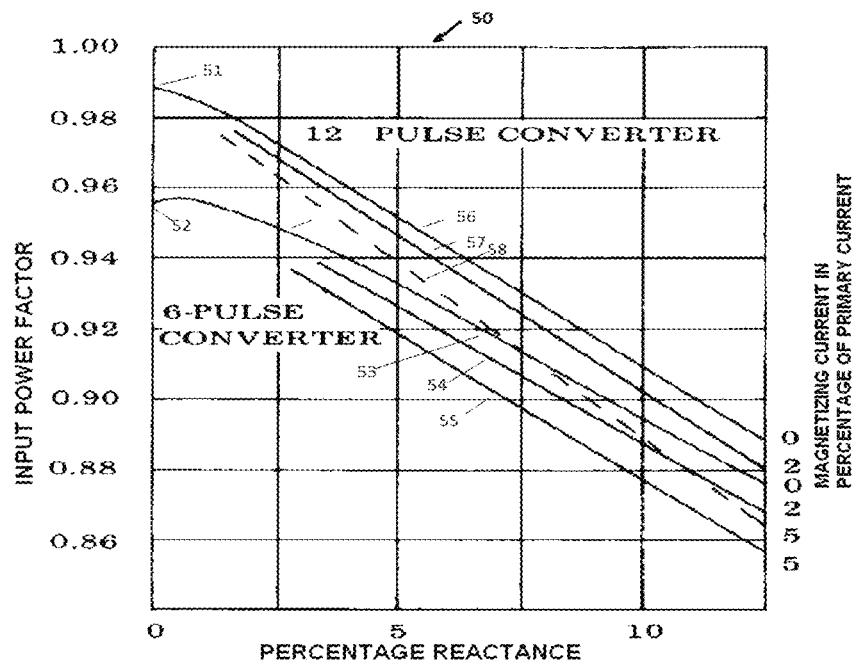
FIG. 5 illustrates the Input power factor versus percentage reactance for 6-pulse and 12-pulse diode rectifier from IEEE Std 519-1992.

Persons skilled in the art will appreciate that elements in the figures are illustrated for simplicity and clarity and may have not been drawn to scale. For example, the dimensions of some of the elements in the figure may be exaggerated relative to other elements to help to improve understanding of various exemplary embodiments of the present disclosure. Throughout the drawings, it should be noted that like reference numbers are used to depict the same or similar elements, features, and structures.

DETAILED DESCRIPTION OF THE PRESENT INVENTION

The following description with reference to the accompanying drawings is provided to assist in a comprehensive understanding of exemplary embodiments of the invention. It includes various specific details to assist in that understanding but these are to be regarded as merely exemplary.

Accordingly, those of ordinary skilled in the art will recognize that various changes and modifications of the embodiments described herein can be made without departing from the scope of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

The present invention relates to a solid state modular crowbarless high voltage regulated DC power supply system, which meet stringent input and output performance requirements demanded by high power RF amplifier, even under wide range of input voltage variations. The present topology has a full range 24 pulsed input systems with inherently low input harmonics and high input power factor making it suitable for high power applications. In addition, it is either ripple free or have low output ripple, low output stored energy, crowbar less, high output stability, high overall efficiency, high system reliability and availability. The present novel solid state modular scheme with full range 24 pulsed input system and ripple free output is developed for −36 kV, 24 Amp HVDC power supply for biasing high power RF amplifiers and the control of its output voltage neither affects input line harmonics and input power factor nor affects the output ripple. Further, in the present method, the input section is completely independent of the output control section. Also, the input section has lower input harmonics enabling the utility supply to cater to the requirement of other nonlinear loads without exceeding harmonics limit specified by IEEE Standard-519, 1992. Furthermore, the method has flexibility for increasing the output voltage to higher value by adding number of switch power modules in series.

Figure 17:
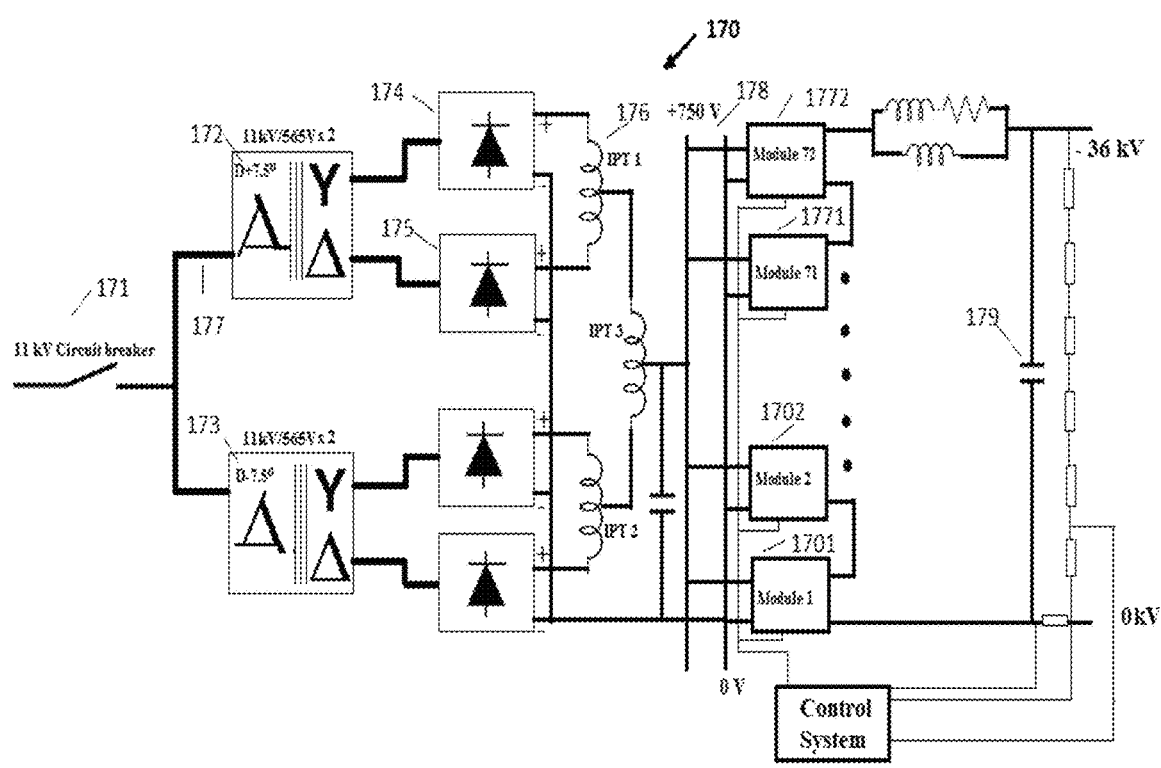
FIG. 17 illustrates the schematic of −36 kV, 24 Amp solid state modular DC power supply, in accordance with the subject matter of the present invention.

The present invention provides, a novel solid state crowbarless modular power supply topology 170 with full range 24 pulse 11 kV input system 70 having inherently low input harmonics and high input power factor as well as auto staggered power modules with low output ripple 96 and low output stored energy has been adopted for the development of a −36 kV, 24 Amp precession regulated HVDC power supply. Input to this power supply is taken directly from 11 kV line 171 creating an uncontrolled DC bus 178, which feeds to a number of DC-DC power modules 1701 to 1772 connected in series and suitably staggered to obtain ripple free high voltage output. This input may also be taken from any high voltage feeder line as well as its DC output may be at any other high voltage, which may even be controlled at the desired level. The schematic of −36 kV, 24 Amp solid state modular power supply is given in FIG. 17. The topology also employs a combination of feed forward and feedback control system with high output stability and zero voltage switched inverter bridge IGBTs with high efficiency.

In an implementation, a full range 24 pulsed 11 kV input system is provided. The present scheme adopted for −36 kV, 24 Amp DC power supply achieves 24 pulse in 3-phase, 11 kV input line for the entire range of operation and is completely independent of the control stage of this power supply. It inherently reduces the input line harmonics and improves the input power factor substantially without needing any input line filters, which provide significant benefit especially for high power system.

In the present invention the primary windings of main transformers are shifted with judicious selection of the number of turns of various windings for realizing 24 pulsed, 11 kV input system with four numbers of 3-phase uncontrolled rectifiers, to minimize input harmonics and to improve the input power factor appreciably. The front end of the proposed invention for −36 kV, 24 Amp HVDC power supply creates an uncontrolled 750 V DC bus for feeding to a number of DC-DC power modules, the outputs of which are connected in series. Staggering of power modules of this power supply has been adopted to reduce output ripple as well as output stored energy. Two modes of operation are presented, one optimized for output ripple free operation at predefined duty cycle while the other for better overall efficiency with low output ripple operation at any arbitrary duty cycle. With 72 numbers of DC-DC power modules each operating at 18 kHz and proper staggering of modules, the output ripple frequency is 2×72×18=2592 kHz and the maximum ripple amplitude is equal to that of DC bus voltage only with low output ripple operation at any arbitrary duty cycle, which gets attenuated significantly even by interconnecting cable capacitances or by a very small damping filter. This arrangement avoids or minimizes output filter and hence avoids the requirement of crowbar completely to protect sensitive RF amplifier, under unfavorable short circuit conditions. The present scheme neither needs any input line filter for input harmonics and power factor improvement nor needs any output filter for limiting output ripple for the whole range of operations of this power supply. The control of this power supply is on low voltage side which makes maintenance easier and facilitates decaying down of high voltage parasitic capacitances after switching OFF the power modules under any unfavorable situations leaving hardly any high voltage safety related issues. Further, the combination of feed forward and feedback control systems achieve better steady state and transient performance of this power supply as input voltage variations are taken care of by feed forward action. Eight out of seventy two numbers of power modules are intentionally kept as active redundant in the power supply so that failure of up to eight power modules will not affect the operation of RF amplifier, thereby increasing the overall system reliability. Faulty modules can be repaired independently in periodic intervals and replaced to minimize downtime and improve the overall system availability.

Figure 6:
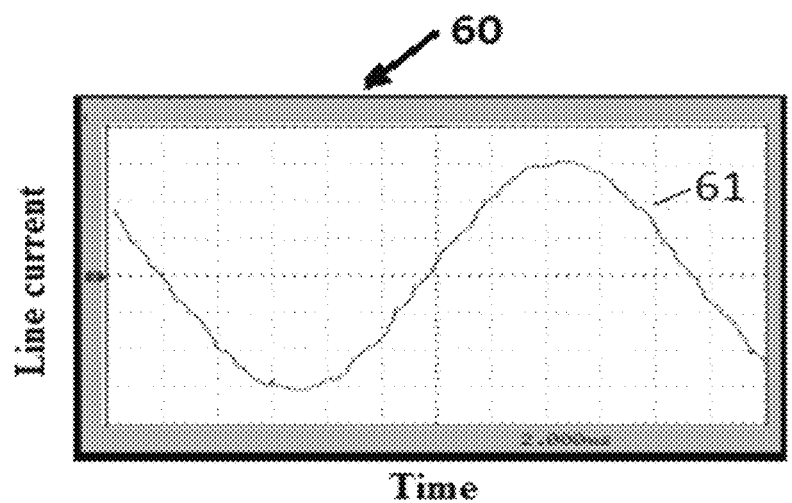
FIG. 6 illustrates 24 pulsed input line current L2 waveform, in accordance with the subject matter of the present invention.
Figure 7:
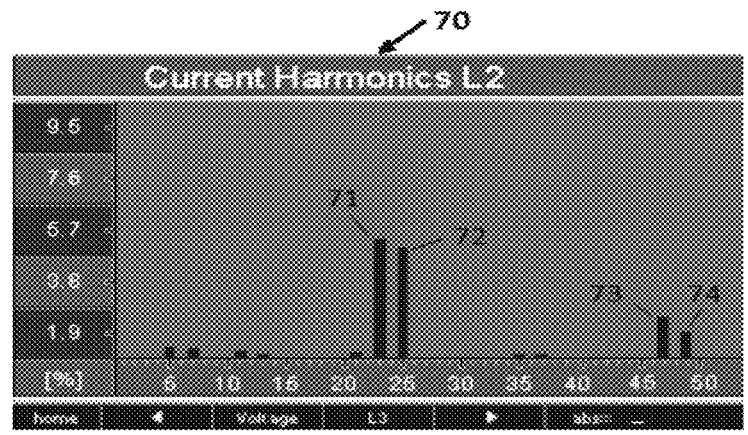
FIG. 7 illustrates in a graph the typical input line current L2 spectrum, in accordance with the subject matter of the present invention.

Shifting of the primary windings of main transformers is adopted in contrast to the standard secondary winding shifting to minimize input harmonics and to improve the input power factor appreciably. Judicious selections of the number of turns of the high voltage primary main and auxiliary windings as well as low voltage secondary Delta and Star windings of the main transformers are done. FIG. 6 shows a 24-pulse input line current waveform in L2 phase corresponding to typical power supply operation at −36 kV, 4.5 Amp and FIG. 7 shows its frequency spectrum with predominant $23^{rd}$ and $25^{th}$ harmonics, which are near to expected ideal waveform. The input system is always 24 pulsed for the entire range of the operation irrespective of the output voltage control of this power supply and numbers of faulty power modules. The present scheme achieves input line current THD<6%, input voltage THD<0.8% and input power factor >0.97 over the entire range of operation of this power supply.

Figure 18:
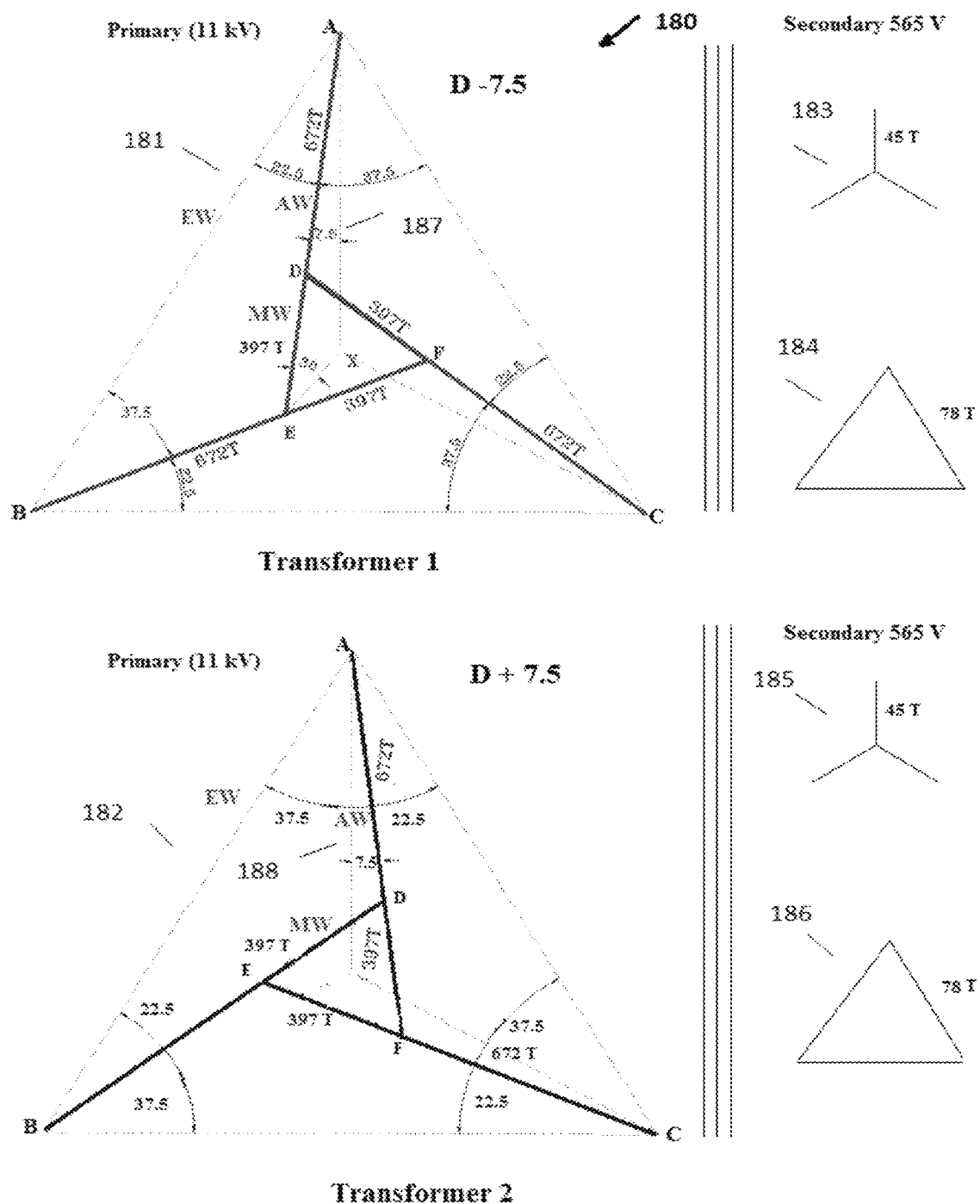
FIG. 18 illustrates the numbers of Turns of various windings of main transformer, in accordance with the subject matter of the present invention.

In an implementation, the input section has a 3-phase, 11 kV input is given to two numbers of main transformers of this power supply, each having two numbers of secondaries, one connected in star 183 and other in delta 184. The secondary windings of these transformers, in turn, feeds to their corresponding 3-phase diode bridge creating an uncontrolled DC bus 178, drawing 12 pulsed current from the input supply system. The high voltage primary windings of these two transformers are shifted 181 and 182 by ±7.5° to achieve 24-pulsed overall input system, which is in contrasts to the standard secondary shifting of transformer windings. Primary windings being on high voltage have larger number of turns, which facilitate to choose the number of turns in main winding and auxiliary winding judiciously. The close matching of actual turns ratio of the auxiliary winding to the main winding up to its fifth decimal place of theoretical value, is feasible due to the primary winding shifting of the main transformer. In addition, the number of turns in the secondary Delta and Star windings are so adjusted that their turns ratio remains close to √3. The theoretical as well as actual turns ratio of auxiliary winding to the main winding of the primary and the turns ratio of Delta winding to Star windings of the secondary of each transformer is presented in FIG. 18. Due to effective cancellation of lower order harmonics 70, this 24-pulse arrangement reduces the input harmonics and improves the input power factor substantially without needing any input line filters, which provides significant benefit especially for the high power system. It should be noted that the input to this power supply is intentionally taken from 3-phase, 11 kV line as it results in reduced percentage voltage drop in line, avoids the need of additional distribution transformer to convert the feeder voltage to 415 V and associated copper loss in the 415 V input cables, thereby increases the overall efficiency of the power supply system.

The said input system always remains 24 pulsed for the entire operating range, even if some power modules become faulty and is completely independent of the control of this power supply.

Theoretical turns ratio of primary Auxiliary Winding (A.W) to the Main Winding (M.W) is given by A.W Turns/(M.W+A.W)Turns=sin 22.5°/sin 37.5°=0.628626

Actual turns ratio of primary Auxiliary Winding (A.W) to the Main Winding (M.W) is given by A.W Turns/(M.W+A.W)Turns=672$T$/1069$T$=0.628625

The close matching of actual turns ratio of the Auxiliary Winding to the Main Winding up to its fifth decimal place of theoretical value, is realized.

Theoretical turns ratio of secondary Δ/Ph. to secondary Y/Ph.=√3:1=1.732

Actual turns ratio of secondary Δ/Ph. to secondary Y/Ph.=78 T/45 T=1.733

With the above choices of number of turns for various windings, a near ideal 24 pulsed input system is achieved as lower order harmonics like $5^{th}$, $7^{th}$, $11^{th}$ and $13^{th}$ gets canceled 70 under balanced input conditions. The 24 pulse input line current waveform 60 and its frequency spectrum 70 for L2 phase corresponding to typical power supply operation at −36 kV, 4.5 Amp DC are shown in FIG. 6 and FIG. 7 respectively.

Figure 12:
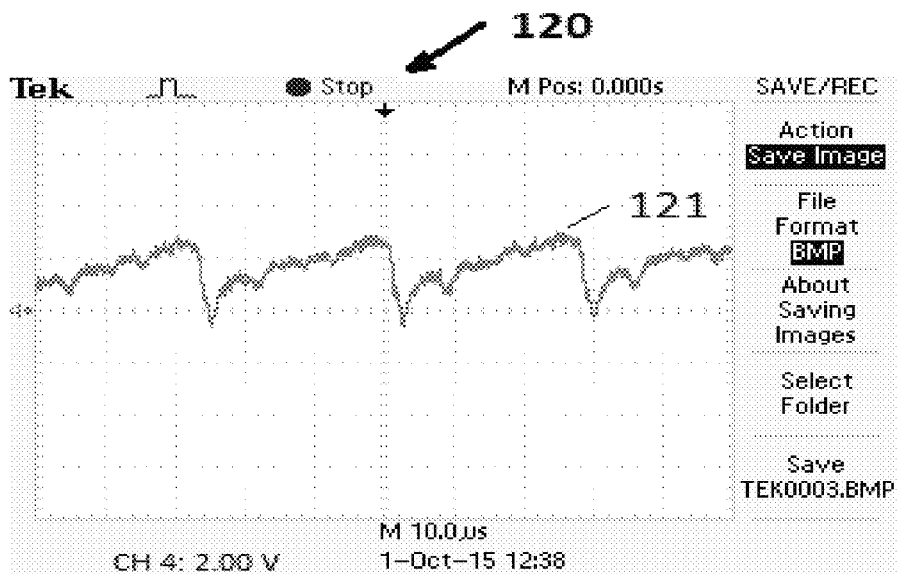
FIG. 12 illustrates the Output voltage ripple at −36 kV, 4.5 Amp at arbitrary duty cycle (Probe ratio=100:1), in accordance with the subject matter of the present invention.
Figure 19:
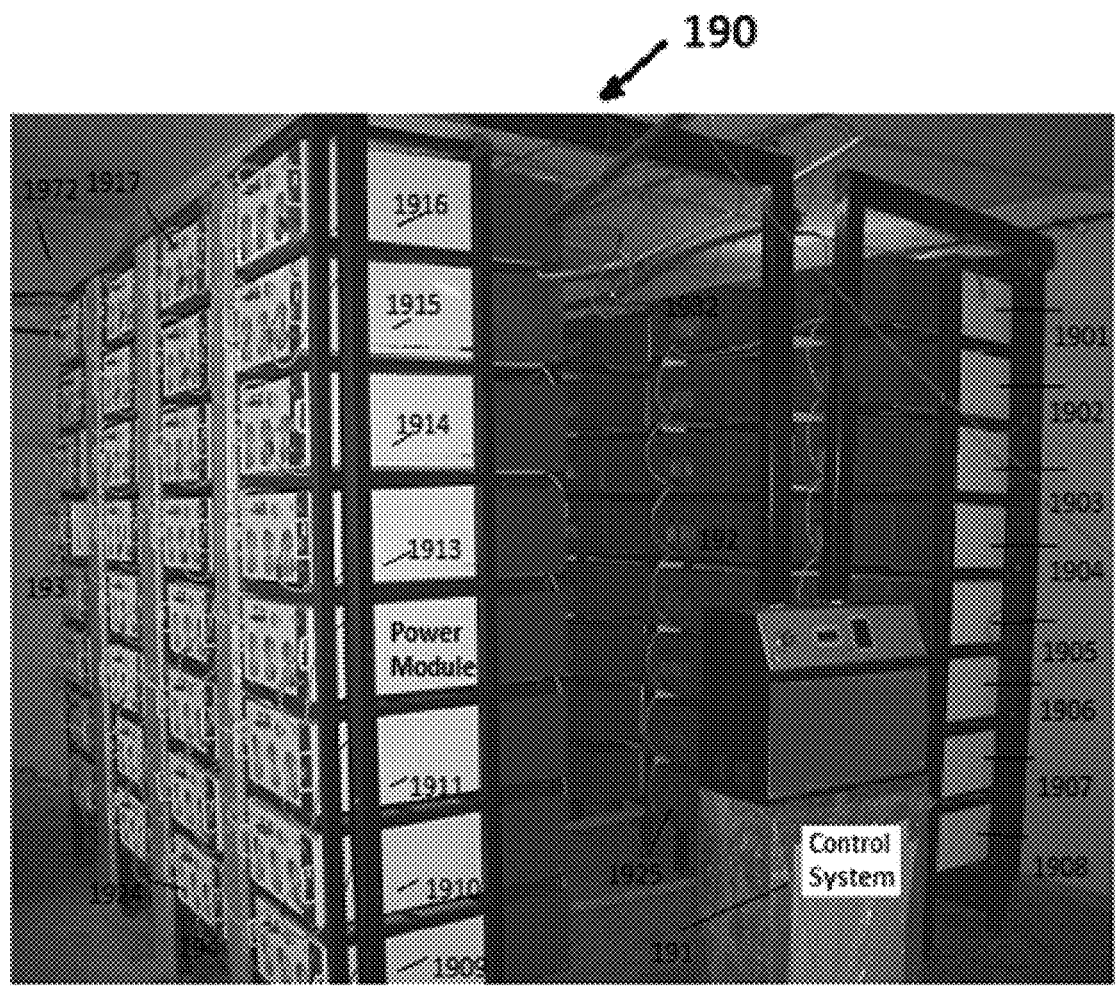
FIG. 19 illustrates the Series connection of seventy two numbers of power modules, in accordance with the subject matter of the present invention.

In an implementation, the output section consists of series connection of low voltage DC-DC power modules 1901 to 1972 with their inverter bridge IGBTs operating in zero voltage switching (ZVS) mode over the entire range of operation minimizing the switching losses significantly. A typical experimental voltage and current waveform across the inverter bridge IGBT switches during switch ON and OFF showing ZVS is presented in FIG. 24. There are 72 numbers of DC-DC power modules each providing average output voltage of 500 V and operating at 18 kHz are suitably staggered to obtain the final −36 kV DC output having effective ripple frequency of 2592 kHz. Hence this power supply topology needs only a very small damping filter with stored energy much less than 10 Joule, thereby avoiding crowbar to protect the sensitive RF amplifier. The typical peak to peak ripple waveform corresponding to −36 kV, 4.5 Amp operation of this power supply is shown in FIG. 12. The photograph of series connection of seventy two numbers of power modules in the output section of this power supply is shown in FIG. 19.

Figure 8:
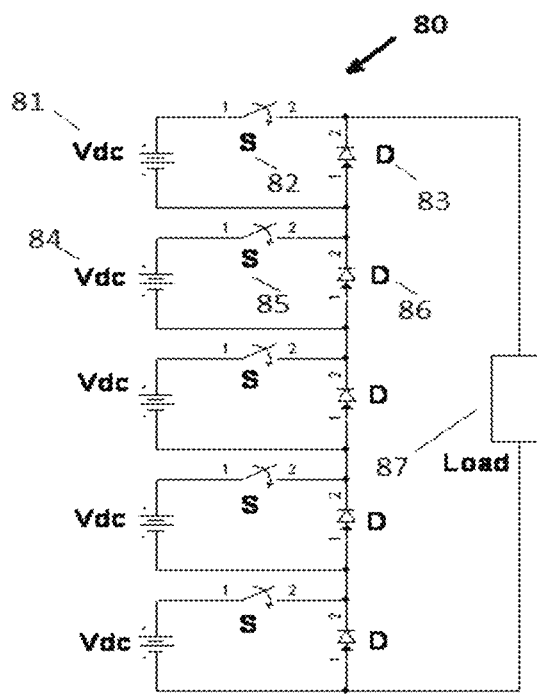
FIG. 8 illustrates Equivalent circuit of five modules in series, in accordance with the subject matter of the present invention.

In an implementation, the strategy of staggering of power modules in −36 kV, 24 Amp DC power supply has been adopted to reduce output ripple as well as output stored energy. The IGBTs in inverter bridge of each power module are operated at switching frequency of 18 kHz, resulting its rectified output repeat at 36 kHz. Hence for simplicity, each module is modeled as a DC source 81 in series with switch S 82. The equivalent circuit of five modules in series 80 is shown in FIG. 8. All the power modules are operated at fixed duty cycle at switching frequency (f) corresponding to time period (T).

Two feasible options for staggering of five numbers of power modules may be used.

Option 1: Full Range Ripple Free Operation at Predefined Duty Cycle

Figure 9:
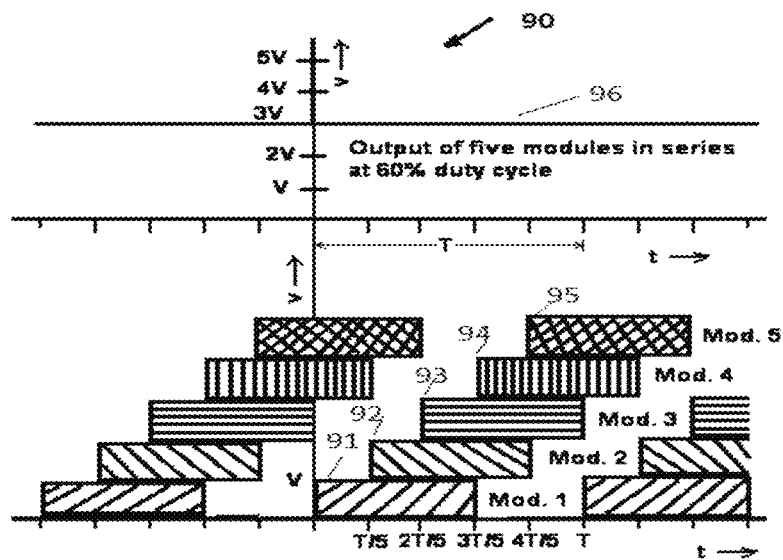
FIG. 9 illustrates the Output voltage waveform of five modules in series showing ripple free operation for 60% duty cycle, in accordance with the subject matter of the present invention.

In this option, output voltage is regulated at desired level by controlling module input DC voltage through chopper switch. Firing pulses to first module inverter bridge IGBTs are given at t=0 and then to inverter bridge IGBTs of $2^{nd}$, $3^{rd}$, $4^{th}$ and $5^{th}$ modules are given at a delay of t=T/5, 2T/5, 3T/5 and 4T/5 respectively. Corresponding to 20%, 40%, 60%, 80%, 100% duty cycle, the sum of output of these five modules will be V, 2V, 3V, 4V, 5V respectively with absolutely no ripple. FIG. 9 shows the output voltage waveform of five staggered modules at 60% duty cycle to provide 3V output.

Option 2: Operation at any Arbitrary Duty Cycle

Figure 10:
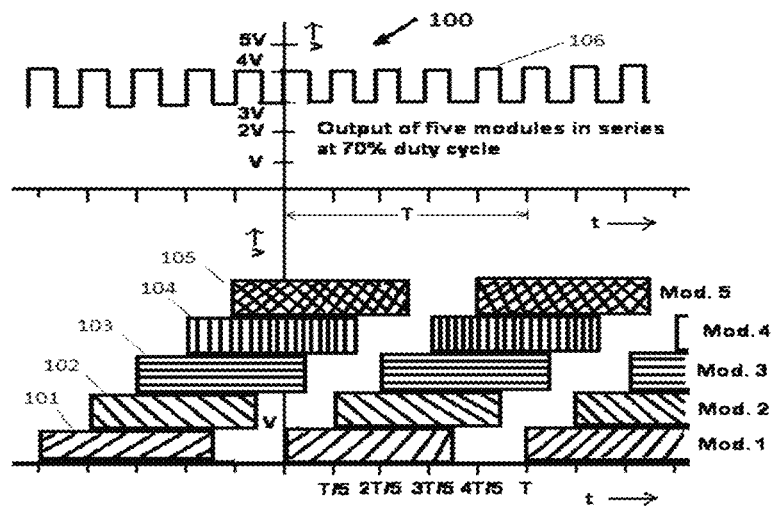
FIG. 10 is an output voltage waveform of five modules showing output ripple for 70% duty cycle, in accordance with the subject matter of the present invention.

In this option, chopper switch is always operated in full conduction and the output voltage is regulated at desired level by controlling the duty cycle of inverter bridge IGBTs of power modules with delay similar to that in option 1. Here, the output ripple frequency is five times the individual power module frequency and the ripple voltage magnitude is equal to the DC bus voltage only. FIG. 10 shows the output voltage waveform of five modules connected in series and staggered at an arbitrary 70% duty cycle. At any instant, the addition of output voltages from five modules will be either 3V or 4V. The chopper switch provides additional isolation during switch OFF of power supply under any unfavorable conditions.

Thus, in the present supply scheme, in −36 kV, 24 Amp power supply, there are 72 numbers of duty cycles points at which the output is absolutely ripple free. It is a unique scheme capable of providing both ripple free operation as well as 24 pulsed input system over the entire range of operation. For any arbitrary duty cycle, the output ripple frequency is 72 times of the individual power module frequency and the ripple voltage magnitude equal to the DC bus voltage only thereby reducing the output ripple filter size as well as stored energy and making the scheme crowbar less.

Figure 11:
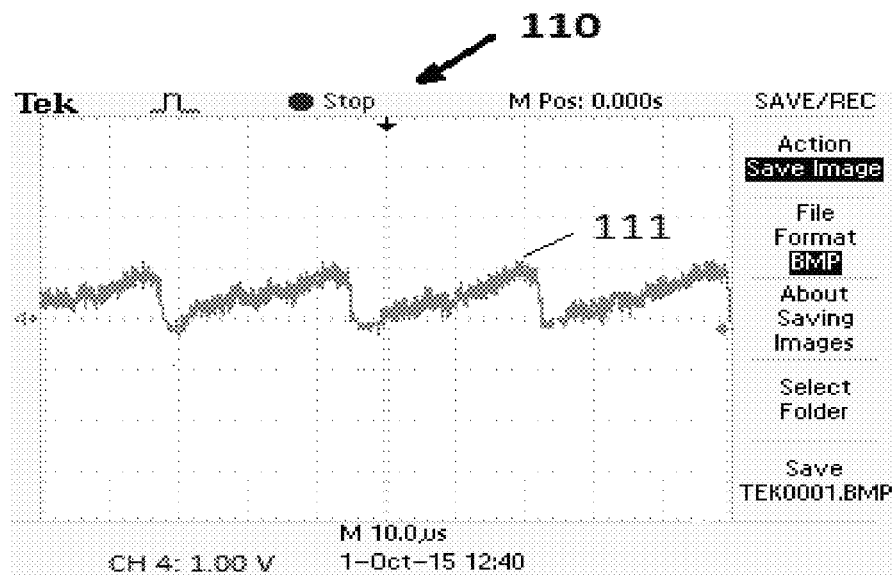
FIG. 11 illustrates the Output voltage ripple at −36 kV, 4.5 Amp in free running mode with predefined duty cycle (Probe ratio=100:1), in accordance with the subject matter of the present invention.

With option 1, each power module is operated in free running mode typically at 75% duty cycle, which is 54 times (integral multiple) of T/72. Here, output voltage is regulated at desired level through chopper switch (typically at 92%). FIG. 11 shows the peak to peak output voltage ripple of approximately 100 V when this power supply is regulated at −36 kV, 4.5 Amp by chopper IGBT. The operation of power supply with control strategy adopted in option 1 reduces the power module efficiency due to switching losses in chopper switch. Again with option 2, each power module is operated at approximately 69% duty cycle with chopper IGBT in full conduction mode for the same input and output condition as in option 1. FIG. 12 shows the peak to peak output voltage ripple of approximately 300 V when this power supply was regulated at −36 kV, 4.5 Amp by inverter bridge IGBT. It should be noted that in both options, due to switching noises and slight overshoots in the leading edge of each power module outputs as well as errors in fixing actual staggering instant of these modules, the output ripple shows a rising trend within each power module frequency of 36 kHz. In the present topology, the output ripple is not affected by the voltage control of this power supply.

In the present invention, during the operation of the power supply, if any of the power modules is faulty, the power supply control and protection system will detect it and gate drives to its entire module IGBTs are blocked. Thus the faulty power modules will be isolated online, thereby not contributing to output voltage and their corresponding free-wheeling diodes 83 gets forward biased by the output voltages of healthy modules. It should be noted that 24 pulsed input system at 11 kV line is maintained even if one or more power modules are faulty and not contributing to the output. The adopted supply scheme also automatically staggers the remaining healthy modules to achieve ripple free output, thereby avoiding crowbar at the output. Faulty modules may be repaired independently in periodic intervals and replaced to minimize downtime and improve the overall system availability.

In an implementation, a unique control topology employing a combination of feed forward control along with feedback loop control is adopted in −36 kV, 24 Amp DC power supply. Feed forward control action has been incorporated by adopting a novel experimental technique.

While implementing digital control system, for better accuracy, a large integer value of 25000 counts is arbitrarily assigned to the maximum phase shift (P.S) of 180° between diagonal pair IGBTs of inverter bridge of power module. Suitable mathematical expression has been formulated to set the forward control action for all possible input voltage variations. This control action sets the P.S near to the desired value.

Figure 13:
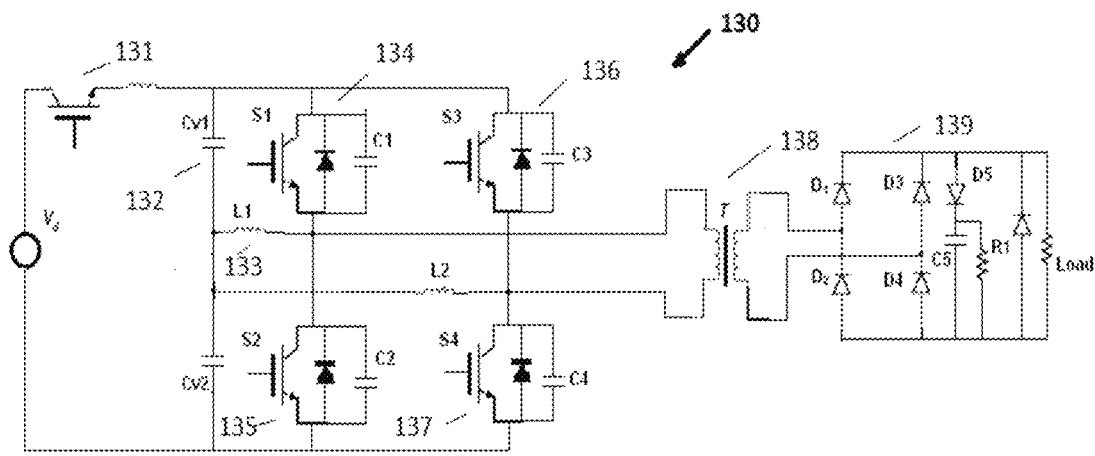
FIG. 13 illustrates the Power circuit of 500 V, 24 Amp power module, in accordance with the subject matter of the present invention.
Figure 14:
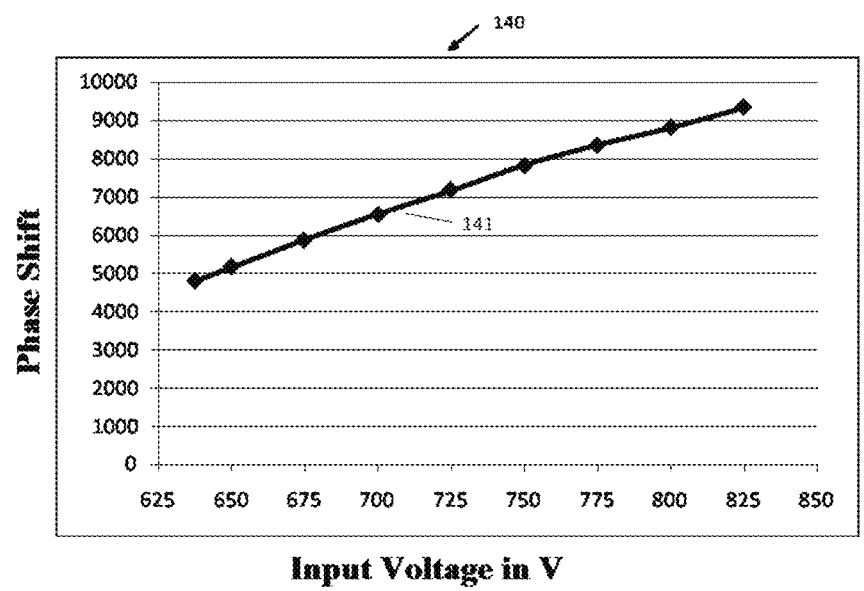
FIG. 14 illustrates in a graph the Phase shift with input voltage at rated load, in accordance with the subject matter of the present invention.

Variations of Phase Shift with Input Voltage at Rated Load:

An −36 kV, 24 Amp DC power supply is designed to operate under −15% to +10% variations in 3-phase, 11 kV input line voltage. With this input voltage variations, the intermediate DC bus voltage, which is input to DC-DC power modules varies from nearly 637.5 V to 825 V. So experiments have been carried out in a DC-DC power module 130 at rated load condition as shown in FIG. 13 and the variations of phase shift under the entire input voltage operating range are tabulated in Table 1 and its pictorial representation is given in FIG. 14. By approximating the curve with a straight line, mathematical expression of phase shift for variation of input voltage is given by $$P.S = 22.68 V_{in} - 9334 \quad (4)$$

This feed forward control action is incorporated suitably by programming DSP in each DC-DC power module.

TABLE 1

DC input voltage versus phase shift for 500 V, 24 Amp output

| Input DC Voltage in Volt | Input DC Current in Amp | Phase Shift |
|---|---|---|
| 637.5 | 18.82 | 4810 |
| 650 | 18.77 | 5166 |
| 675 | 18.23 | 5870 |
| 700 | 17.63 | 6542 |
| 725 | 17.19 | 7166 |
| 750 | 16.36 | 7822 |
| 775 | 16.01 | 8350 |
| 800 | 15.50 | 8810 |
| 825 | 15.35 | 9342 |

Figure 15:
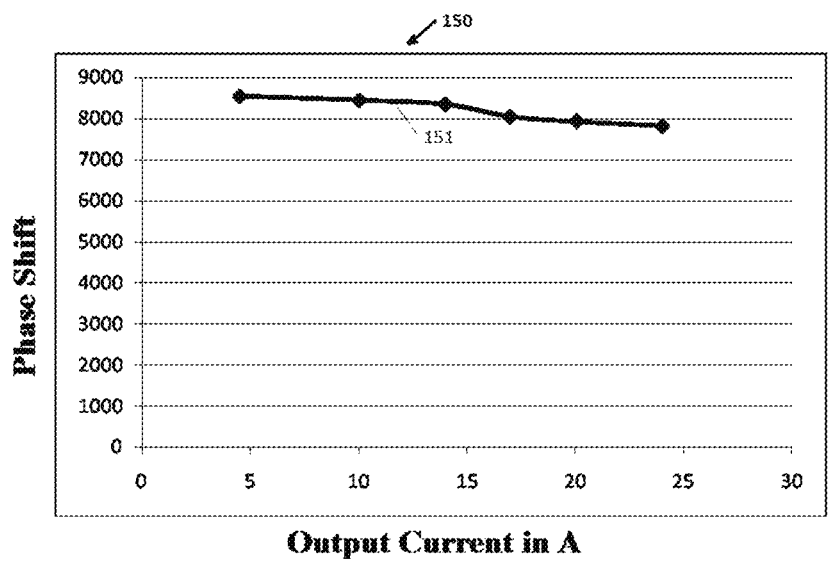
FIG. 15 illustrates in a graph the Phase shift with output current at 500 V output and 750 V input, in accordance with the subject matter of the present invention.

Variations Phase Shift with Output Current at Rated Output and Nominal Input Voltage:

Experiments have also been carried out for output current variations and phase shift of DC-DC power module for the output current variations from 4.5 Amp to 24 Amp are tabulated in Table 2 and its pictorial representation is given in FIG. 15. From this figure, it is clear that load current variations to change in phase shifts have negligible effects as compared to input voltage variations.

TABLE 2

Output current versus phase shift for 500 V output with 750 V input

| Input DC Current in Amp | Output DC Current in Amp | Phase Shift |
|---|---|---|
| 3.10 | 4.5 | 8550 |
| 6.87 | 10 | 8442 |
| 9.6 | 14 | 8350 |
| 11.62 | 17 | 8046 |
| 13.73 | 20.1 | 7934 |
| 16.36 | 24 | 7822 |

Figure 16:
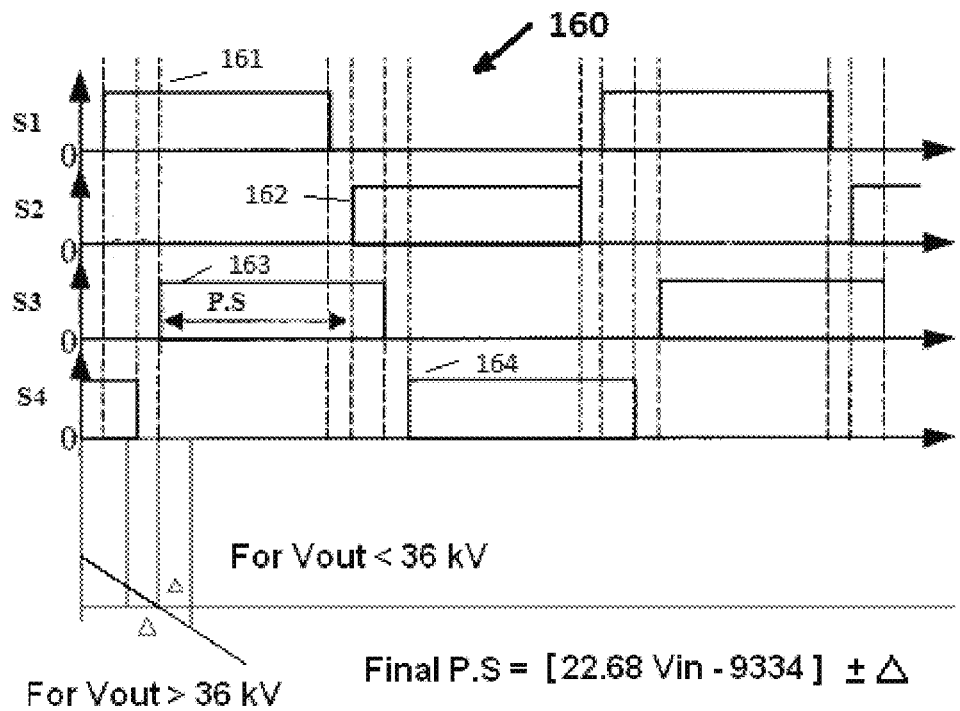
FIG. 16 illustrates the Operation of feedback control loop, in accordance with the subject matter of the present invention.

RF amplifiers normally needs fixed voltage from it's DC bias power supply. However, relatively modern tube based RF amplifiers like Inductive Output Tube (IOT) requires the DC bias voltage to be varied only in limited range near to the rated output voltage to improve the DC to RF conversion efficiency for its operation at lower RF power. Again, it is easier to implement the output set voltage requirement in feedback loop, which vary the reference voltage precisely before loop comes into action. Overriding feedback control has been implemented as shown in FIG. 16 to take care of output set voltage requirements as well as load current variations for regulating this power supply at desired output voltage. If actual output voltage magnitude is less than 36 kV, the feedback loop decreases the P.S, which increases the output voltage and vice versa. The forward control preset the phase shift of DC-DC power modules near the desired level, looking at the available input voltage. But the feedback loop vary the phase shift in a small range in and around the desired phase shift, to ensure that the final output is fine regulated under operation at various load currents. The output voltage variations are found to be below 3% at 36 kV set voltage, by implementing only feed forward control for input voltage variations, which gets further reduced to 0.3% with the incorporation of overriding feedback control loop in addition to the feed forward control.

Figure 20:
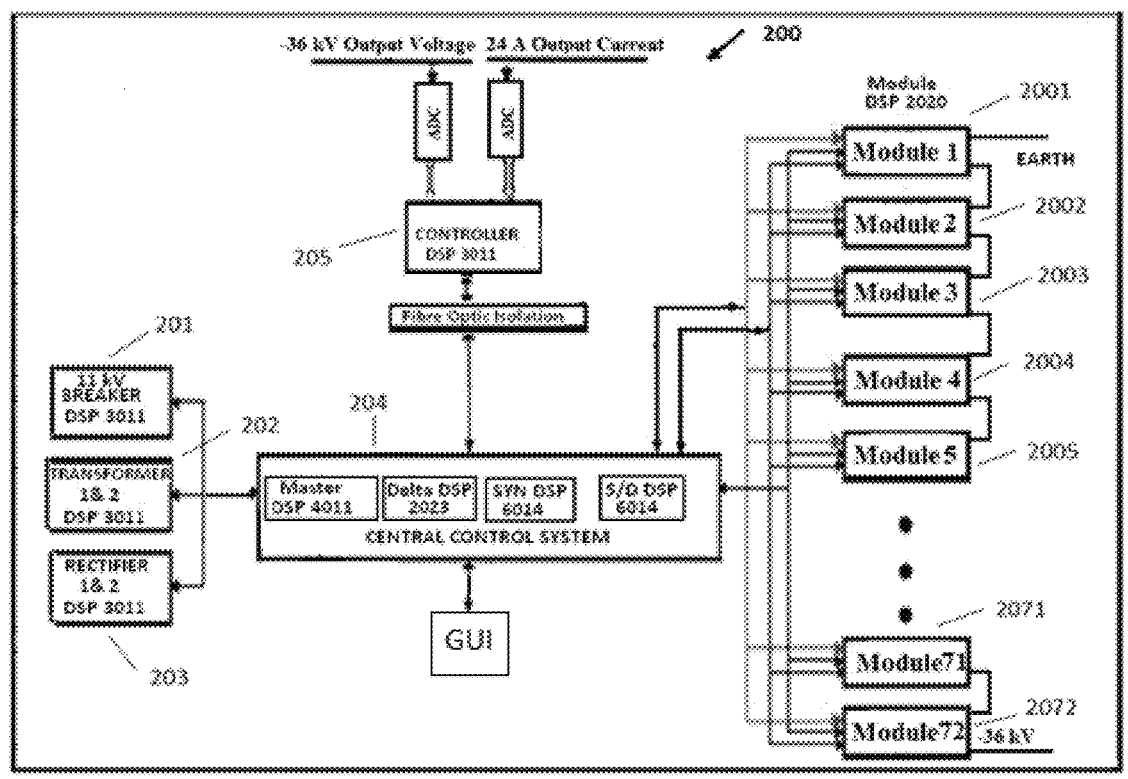
FIG. 20 illustrates the Power supply control and protection system, in accordance with the subject matter of the present invention.

In an implementation, control and protection system are provided. Several microchip make digital signal processors (DSPs) are employed with various subsystems of this power supply for its effective control and protections 200. There is one DSP 2020 in each of the seventy two numbers of power modules, which provides the required PWM pulses as well as monitors the status of various protection features like over current, over voltage and IGBT over temperature protection inside it. In addition, there is one DSP 3011 in 11 kV breaker 201 to monitor the available input voltage and its data is utilized to set feed forward control action in the power modules. Actual output voltage and current 205 are monitored by another DSP 3011, which are sent to DSP 2023 for fine regulation of this power supply through overriding feedback loop. Synchronization and staggered firing 204 to each module is provided by one DSP 6014 and shut down command is provided by another dedicated DSP 6014. All these modules and subsystem DSPs interact with master controller DSP 4011, which communicates with PC for user interface. The detail power supply control and protection system is presented in FIG. 20. Each power module has its inherent protection, which enables it to automatically come out of the circuit, in case of any fault and the control action is updated looking at the number of healthy modules present at any moment of time.

The invention is now illustrated by way of non-limiting examples:

EXAMPLES

Example 1: High System Reliability with Active Redundancy

Eight out of seventy two numbers of power modules are intentionally kept as active redundant in the power supply so that failure of up to eight power modules will not affect the operation of RF amplifier.

The probability of failure of "i" units out of total "N" units is given as $$P(i) = {^N}C_i (1-p)^i p^{N-i}$$

Where p=reliability of individual unit $${^N}C_i = N!/(i! \times (N-i)!)$$

Taking reliability of individual power modules to be 95%, the probability of failure of up to eight power modules are estimated as under.

(a) The probability that all 72 power modules will work well is given by $$P(0) = {^{72}}C_0 (1-p)^0 p^{72} = 0.0249$$

(b) The probability of failure of one power module out of 72 is given by $$P(1) = {^{72}}C_1 (1-p)^1 p^{71} = 0.0943$$

(c) The probability of failure of two power modules out of 72 is given by $$P(2) = {^{72}}C_2 (1-p)^2 p^{70} = 0.1762$$

(d) The probability of failure of three power modules out of 72 is given by $$P(3) = {^{72}}C_3 (1-p)^3 p^{69} = 0.2164$$

(e) The probability of failure of four power modules out of 72 is given by $$P(4) = {^{72}}C_4 (1-p)^4 p^{68} = 0.1965$$

(f) The probability of failure of five power modules out of 72 is given by $$P(5) = {^{72}}C_5 (1-p)^5 p^{67} = 0.1407$$

(g) The probability of failure of six power modules out of 72 is given by $$P(6) = {^{72}}C_6 (1-p)^6 p^{66} = 0.0827$$

(h) The probability of failure of seven power modules out of 72 is given by $$P(7) = {^{72}}C_7 (1-p)^7 p^{65} = 0.0410$$

(i) The probability of failure of eight power modules out of 72 is given by $$P(8) = {^{72}}C_8 (1-p)^8 p^{64} = 0.0175$$

So, with eight numbers of active redundant modules, the system reliability of solid state modular DC power supply=P(0)+P(1)+P(2)+P(3)+P(4)+P(5)+P(6)+P(7)+P(8)=0.9902

This shows improvement in the power supply system reliability up to 99.02% in comparison to 95% reliability of individual power modules. Table 3 shows significant improvement of power supply system reliability with eight numbers of redundant power modules for various reliabilities of individual power modules.

TABLE 3

System reliability with active redundancy

| Reliability of individual power module (p) | System reliability with eight numbers of redundant power modules |
|---|---|
| 95% | 99.02% |
| 96% | 99.78% |
| 97% | 99.92% |
| 98% | 99.99% |

Example 2: Wide Flexibility for Higher Output Voltage

The present supply scheme has wide flexibility in increasing the output voltage to higher value by adding number of DC-DC power modules 130 in series, without requiring any modifications in the existing power modules. High voltage isolation may be provided in the transformers 138 of DC-DC power modules to be floated at higher voltage. Input section also needs no modification as long as total power drawn is within its full power rating. This is a unique feature of the present supply scheme as no other prior art scheme provide flexibilities in increasing the output voltage, as common isolation between input and output is provided by its main transformer.

Example 3: Testing with IOT Amplifier

Figure 21:
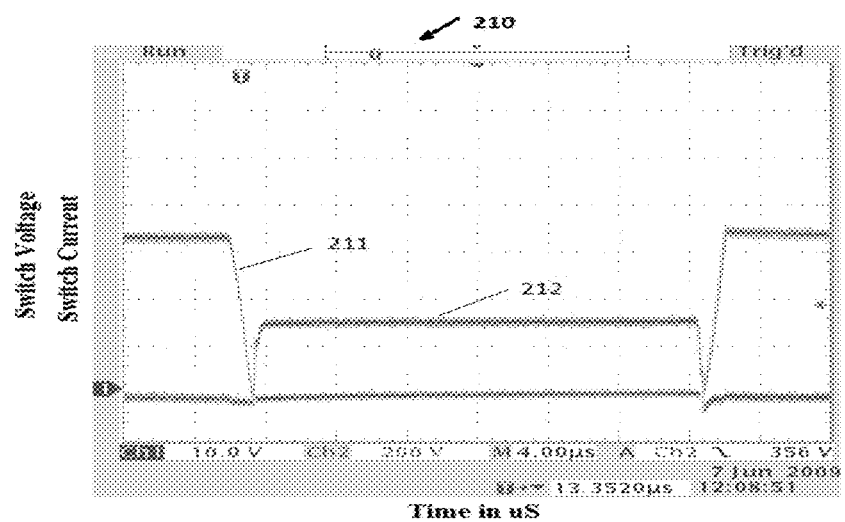
FIG. 21 illustrates Switch voltage-current waveforms showing zero voltage switching (ZVS) operation, in accordance with the subject matter of the present invention.
Figure 22:
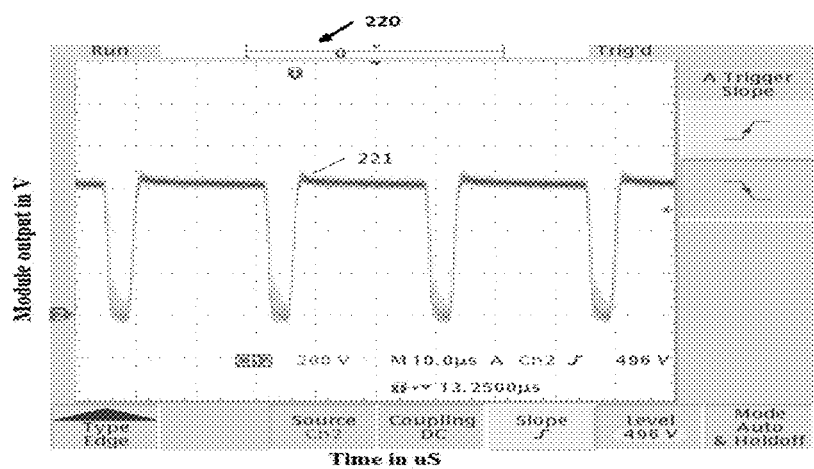
FIG. 22 illustrates Single module rectified output voltage on resistive load, in accordance with the subject matter of the present invention.

The present power supply is tested at −36 kV, 4.5 Amp on an E2V make, IOTD2130 Inductive Output Tube (TOT) RF amplifier and the experimental results obtained are presented. The input system always remains 24 pulsed for the entire range of the operation of this power supply. FIG. 6 shows a 24-pulse input line current waveform in L2 phase and FIG. 7 shows its frequency spectrum with predominant $23^{rd}$ and $25^{th}$ harmonics 71 and 72, which are near to the expected ideal waveform. All IGBTs 134 to 137 in the inverter bridge of power modules are operated in zero voltage switching modes over the entire operating range. It is observed that the DC-DC module output has voltage overshoots, which affect the output performance and was reduced by putting a small capacitor across the rectified output. A diode is placed in series with the capacitor for not allowing its stored energy to be dumped into the RF amplifier under any arcing conditions. Experimental voltage 211 and current waveform 212 across the inverter bridge IGBT switches during switch ON and OFF showing ZVS is presented in FIG. 21. The rectified output voltage waveform of individual power module 221 on resistive load is shown in FIG. 22. This power supply was operated in two modes of operation with all 72 power modules healthy. FIG. 11 shows a typical peak to peak output voltage ripple 111 of approximately 100 V in option 1 when this power supply was regulated at −36 kV, 4.5 Amp by the chopper IGBT. FIG. 12 shows typical peak to peak output voltage ripple 121 of approximately 300 V in option 2 when this power supply was regulated at −36 kV, 4.5 Amp by inverter bridge IGBTs. It should be noted that in both options, due to switching noises and slight overshoots in the leading edge of each power module outputs as well as errors in fixing actual staggering instant of these modules, the output ripple shows a rising trend within each module output frequency of 36 kHz. The output voltage variations are found to be within 3% with only feed forward control for 36 kV set output voltage, which gets further reduced to 0.3% with the incorporation of over-riding feedback control loop, which takes care of load current variations also. Input Transformer-Rectifier units have 98% efficiency at full load. Power modules have 97.26% efficiency when operated at 500 V, 24 Amp outputs and it reduces to 89.5% at 4.5 Amp in option 2. Hence the overall efficiency of the power supply is approximately 95.3% at full load and 87.7% at 4.5 Amp in option 2. With the adoption of control strategy mentioned in option 1, power modules have 96.48% efficiency at full load due to increased losses in the chopper IGBT. The overall efficiency of the power supply gets reduced to 94.6% at full load and 86.9% at 4.5 Amp in option 1. The input and output performance parameters achieved by this power supply is listed in Table. 4. It is planned to operate multiple IOT amplifiers in parallel, each drawing 4.5 Amp at −36 kV from this power supply, which will improve its overall efficiency.

Example 4: Survivability Test

Figure 23:
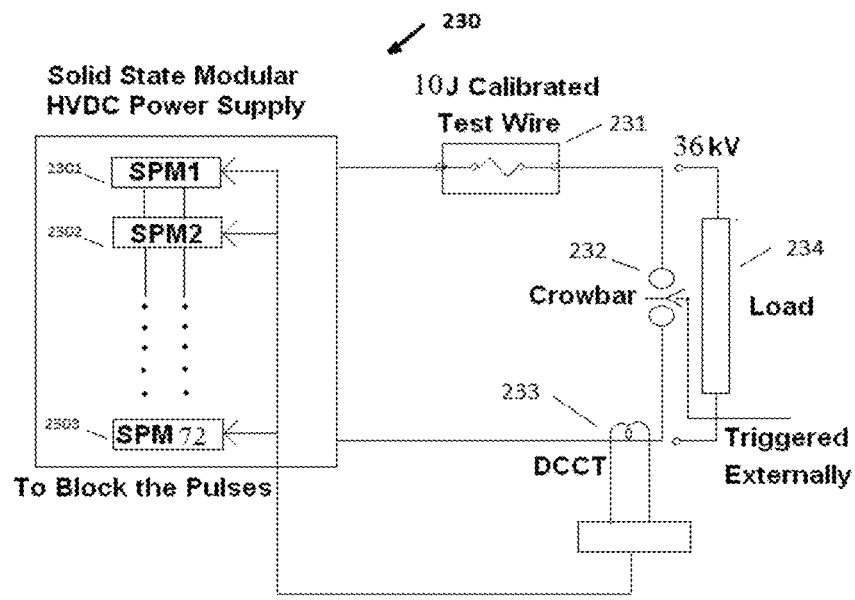
FIG. 23 illustrates Test set up for wire survivability test.
Figure 24:
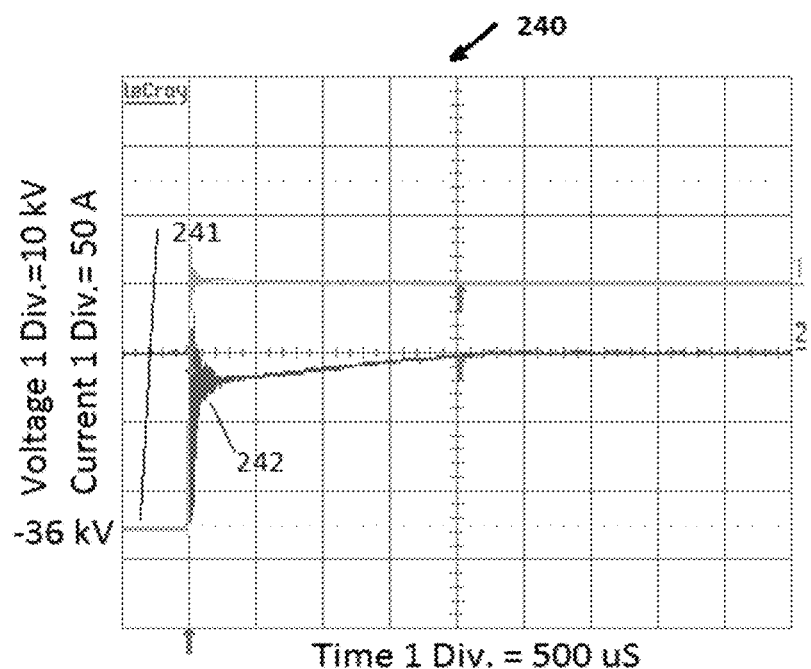
FIG. 24 illustrates Output voltage and current waveform obtained during wire survivability test, in accordance with the subject matter of the present invention.

Wire survivability test 230 was carried out to ensure the suitability of this power supply for feeding to sensitive RF amplifier. In this test, a wire of suitable material and dimension 231 is selected and the RF amplifier arcing condition is intentionally created to get an idea about the amount of fault energies dumped under this condition. In fact, wire survivability test is a stringent test and survivability of wire ensures complete protection of RF amplifier under actual operating condition as when the voltage across arcing RF amplifier is below certain value, it helps in quenching the arc, recovering it completely. An experimental set up as shown in FIG. 23, is made on this power supply with an auxiliary crowbar 232 in series with 33 AWG copper wire of length 10.9 cm calibrated for 10 Joule. The auxiliary crowbar is intentionally triggered, the power supply output current shoots up activating over current protection, which block firing pulses to both chopper IGBT as well as inverter IGBTs of all power modules causing the output voltage to collapse. FIG. 24 shows the experimental output voltage 241 and current waveforms 242 obtained during wire survivability test. The survivability of wire at the end of this test ensures that the stored energy in this power supply is below 10 Joule so there is no need of any crowbars for protecting the sensitive RF amplifier under its arcing conditions.

Some of the important features of the present invention, considered to be noteworthy are mentioned below:

The present supply system and method neither need any input line filters for input harmonics and power factor improvement nor need any output filters for limiting the output ripple for the whole range of operations of this power supply nor even need any crowbars to protect sensitive RF amplifiers, under any unfavorable arcing conditions.

It is capable of providing both full range 24 pulsed 11 kV input system as well as ripple free output.

This power supply takes input directly from 11 kV feeder and hence do not need additional distribution transformer to convert the feeder voltage to 3-phase, 415 V, thereby helps in increasing the overall efficiency of the power supply system.

Even though input to this power supply is taken directly from 11 kV line and its output requirement is also at high voltage, the entire control of this power supply is on low voltage 200, which avoids complex sensing as well as costly fibre optics based communication. It makes maintenance easier and facilitates decaying down of high voltage parasitic capacitances after switching OFF the power modules under any unfavorable situations, leaving hardly any high voltage safety related issues.

This power supply system is crowbar less, efficient, reliable, cost effective and likely to gain popularity to bias sensitive high power RF amplifiers in International scenario.

Input section of the adopted scheme is completely independent of the output control section of this power supply. So the variation of the output voltages and currents as well as the number of faulty modules of this power supply neither affects input line harmonics and input power factor nor affects the output ripple, which is another novel feature of this power supply.

The scheme has unique capability to operate in ripple free mode for the entire range of the operation of this power supply. The output voltage can be regulated at desired level by controlling module input DC voltage through chopper switch. The inverter bridge IGBTs in each power module are always operated at any one of the predefined duty cycle points and suitably staggered for the output ripple free operation.

I claim:

1. A high voltage regulated DC power supply system with full range 24 pulse input for ripple free output for high power RF amplifier, said system comprising:
    an input system coupled to at least four 3-phase uncontrolled rectifiers and adapted to provide uncontrolled low voltage DC bus having low input harmonics and high input power factor;
    a plurality of DC-DC power modules having their output connected in a series configuration and coupled to the said DC bus voltage of said input system;
    each power module comprising
        a DC source,
        an inverter bridge IGBTs operating at predefined duty cycle and staggered to provide ripple free output and low output stored energy, receiving an input voltage from said DC source and providing an output DC voltage and
        an output switch in series for selectively connecting said DC voltage to the output of said power module;
        for each DC power module, a combination of feed forward and feedback control circuit is adapted to regulate the variations in the said input line voltage by presetting the phase shift of DC-DC modules near the desired level and to regulate output at various load current, and configured to provide signals to power module to obtain ripple free high voltage output.

2. The system as claimed in claim 1, wherein the input system is a full range 24 pulse 3 phase 11 kV input system.

3. The system as claimed in claim 1, wherein the input system is adapted to facilitate cancellation of low order harmonics by matching the selection of number of turns of various windings with the actual turns ratio of the auxiliary winding to the main winding close to their theoretical turns ratio and makes turns ratio of Delta to Star windings close to $\sqrt{3}$.

4. The system as claimed in claim 1, wherein DC-DC power modules are configured to provide −36 kV regulated DC output.

5. The system as claimed in claim 1 provides an input current THD<6%, input voltage THD<0.8% and input power factor >0.97.

6. The system as claimed in claim 1, wherein the inverter bridge IGBTs is operable at predefined duty cycle and suitably staggered for the output ripple free operation.

7. The system as claimed in claim 1, wherein staggering of power module is regulated at desired level by controlling module input DC voltage through chopper switch.

8. The system as claimed in claim 1, wherein staggering of power module is regulated by controlling the duty cycle of inverter bridge IGBTs of power modules for low ripple output.

9. The system as claimed in claim 1, wherein auto-staggering of inverter bridge IGBTs of power module is by either providing a full range ripple free operation at predefined duty cycle or providing a low output ripple operation at any arbitrary duty cycle.

10. The system as claimed in claim 1 comprising a main control system operable to drive the DC-DC power modules in a synchronous but phase-shifted manner.

11. The system as claimed in claim 1, wherein the IGBTS of inverter bridge of each power module comprises at least two interleaved power circuits adapted to observe the variation of phase shift with respect to the input voltages and output currents.

12. The system as claimed in claim 1 comprising a first and a second transformer rectifier set adapted to provide secondary voltages that are phase-shifted between the transformers so as to improve input power factor.

13. The system as claimed in claim 1, wherein each power module comprising one digital signal processor, which provides pulse width modulation (PWM) pulses and monitors the status of over current, over voltage and IGBT over temperature protection inside it.

14. The system as claimed in claim 1 comprising a first and a second transformer, the first transformer and the second transformer being configured to provide secondary voltages that are phase-shifted between the transformers so as to provide 24 pulse system.

15. The system as claimed in claim 1 wherein the control of its output voltage neither affects input line harmonics and input power factor nor affects the output ripple.

16. The system as claimed in claim 1 wherein the input and output sections are independent of each other.

17. The system as claimed in claim 1 wherein control and protection system is on the low voltage even though both its input and output are on the high voltages.

18. The system as claimed in claim 1 wherein faulty switch power modules are isolated online and the number of faulty (or healthy) switch power modules neither affects input line harmonics and input power factor nor affects the output ripple.

19. The system as claimed in claim 1 further comprising active redundant switch power modules adapted to improve the system reliability.

20. The system as claimed in claim 1 adapted to provide both full range ripple free high voltage output as well as 24 pulsed 11 kV input system simultaneously.

* * * * *